(12) United States Patent
Shimoyama

(10) Patent No.: US 12,740,403 B2
(45) Date of Patent: Sep. 15, 2026

(54) SEMICONDUCTOR STORAGE DEVICE, PRINTING APPARATUS, AND WRITE CONTROL METHOD OF SEMICONDUCTOR STORAGE DEVICE

(71) Applicant: Canon Kabushiki Kaisha, Tokyo (JP)

(72) Inventor: Yoji Shimoyama, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 773 days.

(21) Appl. No.: 18/169,290

(22) Filed: Feb. 15, 2023

(65) Prior Publication Data

US 2023/0298994 A1 Sep. 21, 2023

(30) Foreign Application Priority Data

Mar. 17, 2022 (JP) ................................ 2022-042777

(51) Int. Cl.

| | |
|---|---|
| ***H01L 23/525*** | (2006.01) |
| ***G03F 7/00*** | (2006.01) |
| ***H03F 3/04*** | (2006.01) |
| ***H03K 5/02*** | (2006.01) |
| ***H10B 12/00*** | (2023.01) |
| ***H10B 63/10*** | (2023.01) |

(Continued)

(52) U.S. Cl.

CPC ........ *H10W 20/491* (2026.01); *G03F 7/0015* (2013.01); *H03F 3/04* (2013.01); *H03K 5/02* (2013.01); *H10B 12/09* (2023.02); *H10B 63/10* (2023.02); *H10D 89/60* (2025.01)

(58) Field of Classification Search

CPC ... H01L 23/525; H01L 23/5252; H10B 12/00; H10B 12/09; H10B 20/25; H10B 63/10; H10D 89/60; H03F 3/04; H03F 3/45; H03F 3/45475; H03K 5/02; H03K 5/04; G03F 7/00; G03F 7/0015; G11C 17/16; G11C 17/18; H10W 20/49; H10W 20/491

See application file for complete search history.

(56) References Cited

U.S. PATENT DOCUMENTS

| | | | | |
|---|---|---|---|---|
| 6,434,048 B1 * | 8/2002 | Tran | ..................... | G11C 7/1006 365/185.18 |
| 6,501,697 B1 * | 12/2002 | Perner | ................. | G11C 11/1673 365/158 |
| 7,388,770 B2 | 6/2008 | Namekawa et al. | | |

(Continued)

FOREIGN PATENT DOCUMENTS

| | | |
|---|---|---|
| JP | 2006-196079 A | 7/2006 |
| JP | 2017117854 A | 6/2017 |

OTHER PUBLICATIONS

Japanese Office Action dated Nov. 4, 2025 in counterpart Japanese Patent Appln. No. 2022-042777.

(Continued)

*Primary Examiner* — Brook Kebede
(74) *Attorney, Agent, or Firm* — Venable LLP

(57) ABSTRACT

A semiconductor storage device controls writing in a memory unit including an anti-fuse element. The device includes a comparison unit configured to compare, with a reference voltage, a voltage generated across a resistor element connected in series with a power supply line used to energize the anti-fuse element, and a control unit configured to, in writing in the memory unit, control writing in the anti-fuse element of the memory unit based on an output of the comparison unit.

12 Claims, 9 Drawing Sheets

(51) Int. Cl.
*H10D 89/60* (2025.01)
*H10W 20/49* (2026.01)

(56) References Cited

U.S. PATENT DOCUMENTS

| | | | | |
|---|---|---|---|---|
| 2008/0158933 | A1* | 7/2008 | Allen | G11C 17/18<br>365/96 |
| 2011/0273949 | A1 | 11/2011 | Chen | |
| 2012/0014156 | A1* | 1/2012 | Park | G11C 7/1084<br>327/306 |
| 2016/0179113 | A1* | 6/2016 | Taigor | G11C 16/06<br>327/513 |

OTHER PUBLICATIONS

Co-pending U.S. Appl. No. 18/188,546, filed Mar. 23, 2023.
Co-pending U.S. Appl. No. 18/176,584, filed Mar. 1, 2023.

* cited by examiner

A
VHT
B
C
END
CP0
Vref
OP0
Ep
12
i
Rsh
TS2
TS1
Rs
T112
Ca
Rp
T111
MD1
GND
11
MP1
MN1
VDD
10
TP1
TP2
Sig
13
CONTROL CIRCUIT
END
WEN 100
101
102
104
105
106
107
108
109
110
11
12
103a
103b
VH
GND
VHT
VDD
EP
I
V
Vref
Rh
MD2
Rs
Rp
MD1
MP1
MN1
Sig
END
CLK,DATA,LT,HE
306
CVH
CVHT
300
301
302
303
304
305
CPU
310

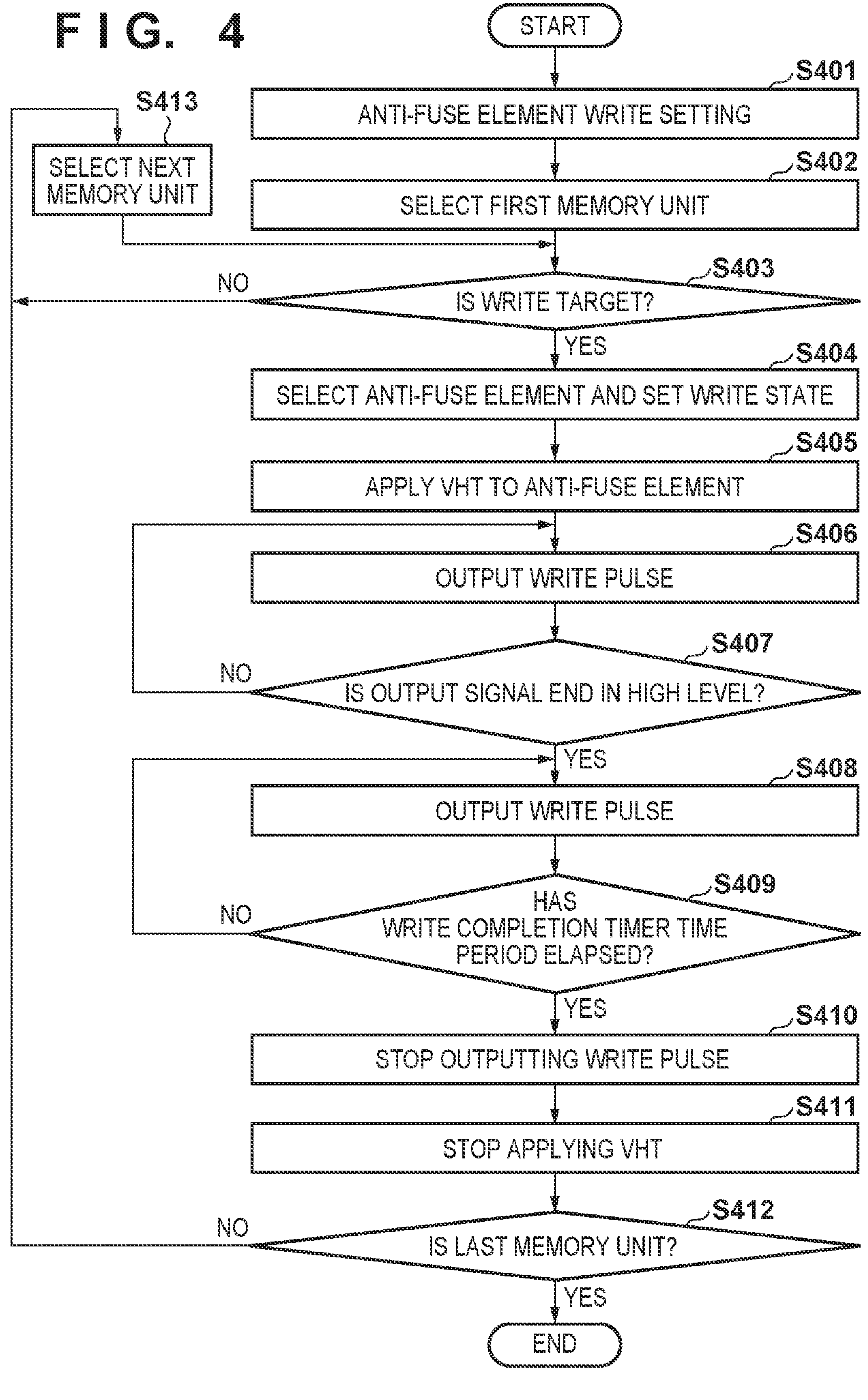
F I G. 4
START
S401
ANTI-FUSE ELEMENT WRITE SETTING
S402
SELECT FIRST MEMORY UNIT
S413
SELECT NEXT MEMORY UNIT
S403
IS WRITE TARGET?
NO
YES
S404
SELECT ANTI-FUSE ELEMENT AND SET WRITE STATE
S405
APPLY VHT TO ANTI-FUSE ELEMENT
S406
OUTPUT WRITE PULSE
S407
IS OUTPUT SIGNAL END IN HIGH LEVEL?
NO
YES
S408
OUTPUT WRITE PULSE
S409
HAS WRITE COMPLETION TIMER TIME PERIOD ELAPSED?
NO
YES
S410
STOP OUTPUTTING WRITE PULSE
S411
STOP APPLYING VHT
S412
IS LAST MEMORY UNIT?
NO
YES
END VHT
Sig
CURRENT i
END
24 [V]
0 [V]
Hi
Lo
2.9 [mA]
0 [mA]
Hi
Lo
T1
T2
T3
T4
CURRENT THRESHOLD VALUE
2.0[mA]
TIME
S405
S406
S406
S407
No
S407
Yes
S408
S408
S409
No
S409
Yes
S410
S411

1100
101
102
104
105
106
107
108
109
110
103a
103b
VH
GND
VHT
VDD
EP
i
Rh
MD2
Rs
Rp
MD1
MP1
MN1
11
CLK,DATA,LT,HE
801
CVH
CVHT
Vref
12
END
300
301
302
303
304
305
CPU
310

1100
101
102
104
105
106
107
108
109
110
103a
103b
VH
GND
VHT
VDD
EP
i
Rh
MD2
Rs
Rp
MD1
11
MP1
MN1
2921
CVH
CVHT
2930
12
Vref
END
303
304
305
302
CPU
310
301
CLK,DATA,LT,HE

SEMICONDUCTOR STORAGE DEVICE, PRINTING APPARATUS, AND WRITE CONTROL METHOD OF SEMICONDUCTOR STORAGE DEVICE

BACKGROUND OF THE INVENTION

Field of the Invention

The present invention relates to a semiconductor storage device including an anti-fuse element, a printing apparatus, and a write control method of the semiconductor storage device.

Description of the Related Art

In recent years, a semiconductor storage device uses a One Time Programmable (OTP) memory for recording the specific information such as the chip ID and the setting parameter of a product after completion of the product. There are two kinds of OTP memories, that is, an OTP memory using a fuse element and an OTP memory using an anti-fuse element. A conventional technique using the anti-fuse element is, for example, an arrangement described in Japanese Patent Laid-Open No. 2006-196079.

In the above-described conventional technique, during a program operation, the write state of the anti-fuse element is determined in a power supply state in which the voltage used for writing in the anti-fuse element is kept constant. Therefore, if a resistor element is connected in parallel with the anti-fuse element to improve Electrostatic Discharge (ESD) resistance, the write state of the anti-fuse element may not be accurately determined.

SUMMARY OF THE INVENTION

The present invention provides a technique capable of accurately determining the write state of an anti-fuse element with improved surge resistance.

According to one aspect of the present invention, there is provided a semiconductor storage device configured to control writing in a memory unit including an anti-fuse element, the device comprising: a comparison unit configured to compare, with a reference voltage, a voltage generated across a resistor element connected in series with a power supply line used to energize the anti-fuse element; and a control unit configured to, in writing in the memory unit, control writing in the anti-fuse element of the memory unit based on an output of the comparison unit.

Further features of the present invention will become apparent from the following description of exemplary embodiments (with reference to the attached drawings).

BRIEF DESCRIPTION OF THE DRAWINGS

FIG. 4 is a flowchart for explaining a write operation of an anti-fuse element performed by a printing apparatus control circuit of the printing apparatus according to the second embodiment;

DESCRIPTION OF THE EMBODIMENTS

Figure 1:
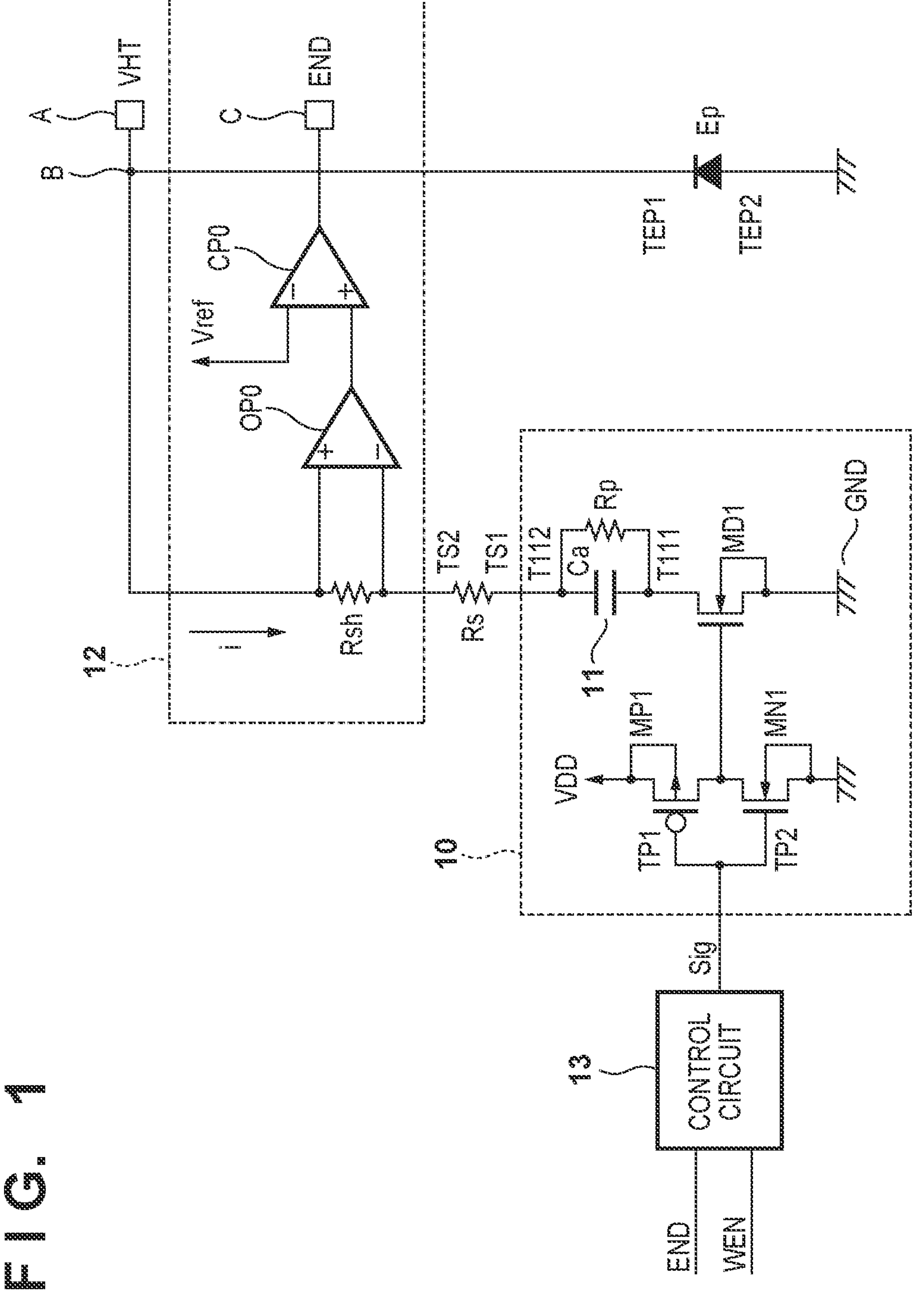
FIG. 1 is a circuit diagram including a memory unit of a semiconductor storage device according to the first embodiment of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

FIG. 1 is a circuit diagram including a memory unit 10 of a semiconductor storage device according to the first embodiment of the present invention. FIG. 1 shows a state before information is written in an anti-fuse element 11 of the memory unit 10.

The memory unit 10 includes a first transistor MP1, a second transistor MN1, a third transistor MD1, the anti-fuse element 11, and a resistor element Rp (first resistor element) connected in parallel with the anti-fuse element 11. Here, the first transistor MP1 and the second transistor MN1 form an inverter circuit that drives the third transistor MD1 serving as the drive element of the anti-fuse element 11. An output of the inverter circuit is input to the gate of the third transistor MD1.

A write state detection unit 12 includes a resistor element Rsh (second resistor element), an amplifier (operational amplifier) OP0, and a comparator CP0. The resistor element Rsh is connected in series with the power supply line of a high voltage VHT supplied from a terminal A. Both ends of the resistor element Rsh are connected to the input terminals of the amplifier OP0. In this manner, the resistor element Rsh converts the current flowing from the terminal A to the anti-fuse element 11 into a voltage value, and inputs the voltage value to the amplifier OP0. The amplifier OP0 amplifies the potential difference generated in the resistor element Rsh, and inputs the amplified potential difference to the input terminal (+) of the comparator CP0. The comparator CP0 compares the input potential with a reference voltage Vref, and outputs the result to a terminal C as an output signal (END). The terminal A on the current supply side is grounded via an ESD protection element EP. A resistor element Rs (third resistor element) is connected between the anti-fuse element 11 and the resistor element Rsh.

A control circuit 13 controls the first transistor MP1 and the second transistor MN1.

Since FIG. 1 shows the state before information is written in the anti-fuse element 11, the anti-fuse element 11 is expressed by a capacitor Ca.

The first transistor MP1 is a p-type transistor, and the second transistor MN1 is an n-type transistor. A control signal Sig is input from the control circuit 13 to the gate of the first transistor MP1 and the gate of the second transistor MN1. A first terminal TP1 of the first transistor MP1 is wired to a logic power supply voltage VDD, and a second terminal TP2 of the second transistor MN1 is connected to a ground wiring GND.

The third transistor MD1 is a high breakdown voltage transistor, and controls voltage application to the anti-fuse element 11. The first terminal of the third transistor MD1 is connected to a first terminal T111 of the anti-fuse element 11, and the second terminal of the third transistor MD1 is connected to the ground wiring GND. A second terminal T112 of the anti-fuse element 11 is connected to a first terminal TS1 of the resistor element Rs. Here, a high breakdown voltage transistor refers to a transistor that is formed so as not to fail even if a high voltage, which a transistor in a general logic circuit such as a control unit cannot withstand, is applied.

The control circuit 13 outputs the control signal Sig based on a write control signal WEN input from the outside and the output signal END of the comparator CP0.

The terminal A is a pad for electrically connecting the memory unit 10 and an external element, and serves as a terminal for applying a voltage to the anti-fuse element 11. Further, the terminal A is connected to a first terminal TEP1 of the ESD protection element EP at a node B, and a second terminal TEP2 of the ESD protection element EP is connected to the ground wiring GND. The resistor element Rsh and the resistor element Rs are provided in the current path between the anti-fuse element 11 and the node B. The first terminal TS1 of the resistor element Rs is connected to the second terminal T112 of the anti-fuse element 11, and a second terminal TS2 of the resistor element Rs is connected to the resistor element Rsh.

In a semiconductor storage device that uses an anti-fuse element as a memory, information is recorded by conduction and non-conduction of the anti-fuse element. In such a semiconductor storage device, an extremely large surge current may enter the semiconductor storage device from the terminal A due to Electro-Static Discharge (ESD). That is, due to ESD, a surge voltage that is much higher than the normal write voltage and read voltage may be applied to the anti-fuse element 11, and the anti-fuse element 11 not intended to be conductive may become conductive. Due to this, the information recorded in the semiconductor storage device may be changed.

To prevent this, the ESD protection element EP is provided between the terminal A and the ground wiring GND to take an ESD countermeasure. At this time, by the resistor element Rs provided between the anti-fuse element 11 and the node B at which the terminal A and the ESD protection element EP are connected, the resistor element Rs hinders a current flow in the current path between the terminal A and the anti-fuse element 11. With this, a large surge current easily flows to the ESD protection element, so that the anti-fuse element 11 can be more effectively protected from the ESD surge current.

In the memory unit 10, the resistor element Rp is arranged in parallel with the anti-fuse element 11. When the high breakdown voltage NMOS transistor MD1 is in an OFF state, the resistor element Rp has an effect of aligning the potentials at both ends of the capacitor Ca, which is the anti-fuse element 11, and this further improves the surge resistance. The effect of aligning the potentials at the both ends is better when the resistance value of the resistor element Rp is low.

Next, an operation in writing will be described.

When writing information to the anti-fuse element 11, the control signal WEN is set in a write set state. Thus, the control circuit 13 outputs the control signal Sig at low level. With this, the third transistor MD1, which is the high breakdown voltage NMOS transistor, is set in an ON state. This allows the high voltage VHT to be applied to two electrodes, an upper electrode and a lower electrode, forming the anti-fuse element 11. Let i be the current flowing from the terminal A to the GND wiring at this time.

Before dielectric breakdown of a gate oxide film between the two electrodes of the anti-fuse element 11 occurs, a current flows to the resistor element Rp since the anti-fuse element 11 is a capacitive element. Letting ia be a current before the write in the anti-fuse element 11, the current ia is expressed by:

$$ia = VHT/(Rs + Rsh + Rp)$$

For example, if the resistance value of the resistor element Rs is 1 [kΩ], the resistance value of the resistor element Rp is 80 [kΩ], the resistance value of the resistor element Rsh is 0.5 [kΩ], and the high voltage VHT is 24 [V], the current ia is 296 [μA].

Subsequently, dielectric breakdown of the gate oxide film between the two electrodes of anti-fuse element 11 occurs, and information is written in the anti-fuse element 11. With this, while the anti-fuse element 11 is the capacitive element before the write, it becomes a resistor element Rb after the write, and the current flows to the resistor element Rb and the resistor element Rp. At this time, letting a current ib be a current after the write in the anti-fuse element 11, the current ib is expressed by:

$$ib = VHT/\left(Rs + Rsh + Rp \times Rb/(Rp + Rb)\right)$$

For example, if the resistance value of the resistor element Rs is 1 [kΩ], the resistance value of the resistor element Rp is 80 [kΩ], the resistance value of the resistor element Rb is 8 [kΩ], the resistance value of the resistor element Rsh is 1 [Ω], and the high voltage VHT is 24 [V], the current ib is 2.90 [mA]. In this manner, after writing in the anti-fuse element 11, the value of current flowing through the anti-fuse element 11 increases.

Next, a method of determining whether information has been written in the anti-fuse element 11 will be described.

A potential difference VRsh_a across the resistor element Rsh before the voltage VHT is applied to the anti-fuse element 11 and writing in the anti-fuse element 11 is performed, that is, before the dielectric breakdown occurs is expressed by:

$$VRsh\_a = ia \times Rsh = VHT/(Rs + Rsh + Rp) \times Rsh$$

The amplifier circuit OP0 amplifies VRsh_a, and the comparator circuit CP0 compares the output voltage of the amplifier circuit OP0 with the reference voltage Vref. In this case, since the output voltage of the amplifier circuit OP0 is lower than the reference voltage Vref, the comparator circuit CP0 outputs the output signal END at low level indicating an unwritten state.

For example, if the resistance value of the resistor element Rs is 1 [kΩ], the resistance value of the resistor element Rp is 80 [kΩ], the resistance value of the resistor element Rsh is 1 [Ω], and the high voltage VHT is 24 [V], the amplifier circuit OP0 differentially amplifies VRsh_a by a factor of 1. At this time, an output voltage VPO0_*a* of the amplifier circuit OP0 is expressed by $$VPO0\_a = VRsh\_a = 0.296\ [\text{mV}]$$

On the other hand, a potential difference VRsh_b across the resistor element Rsh after the voltage VHT is applied to the anti-fuse element 11 and information is written in the anti-fuse element 11, that is, after the dielectric breakdown occurs is expressed by:

$$\begin{aligned} VRsh\_b &= ib \times Rsh \\ &= VHT/(Rs + Rsh + Rp \times Rb/(Rp + Rb)) \times Rsh \end{aligned}$$

The amplifier circuit OP0 amplifies VRsh_b, and the comparator circuit CP0 compares the output voltage of the amplifier circuit OP0 with the reference voltage Vref. In this case, the output voltage of the amplifier circuit OP0 is higher than the reference voltage Vref, so that the comparator circuit CP0 outputs the output signal END at high level, which indicates the write state.

For example, if the resistance value of the resistor element Rs is 1 [kΩ], the resistance value of the resistor element Rp is 80 [kΩ], the resistance value of the resistor element Rb is 8 [kΩ], the resistance value of the resistor element Rsh is 1 [Ω], and the high voltage VHT is 24 [V], the amplifier circuit OP0 differentially amplifies VRsh_b by a factor of 1. In this case, an output voltage VPO0_*b* of the amplifier circuit OP0 is expressed by:

$$VPO0\_b = VRsh\_b = 2.90\ [\text{mV}]$$

The reference voltage Vref is set to a value that facilitates determination of an output voltage VPO of the amplifier circuit OP0 before and after writing in the anti-fuse element 11. For example, the reference voltage Vref is set to a value that makes the potential difference across the resistor element Rsh be 2.0 [mV] and the current i be 2.0 [mA]. With this, as has been described above, before writing in the anti-fuse element 11 is performed, since the output voltage of the amplifier circuit OP0 is lower than the reference voltage Vref, the output signal END is output at low level. On the other hand, after writing in the anti-fuse element 11 is performed, since the output voltage of the amplifier circuit OP0 is higher than the reference voltage Vref, the output signal END is output at high level.

Next, a use of the determination result as to whether information has been written in the anti-fuse element 11 will be described.

If the output signal END of the comparator circuit CP0 is output at low level indicating the unwritten state of the anti-fuse element 11, the control circuit 13 continues writing in the anti-fuse element 11. If the output signal END of the comparator circuit CP0 is output at high level indicating the write state of the anti-fuse element 11, the control circuit 13 terminates writing in the anti-fuse element 11 after a predetermined time elapses.

Figure 2:
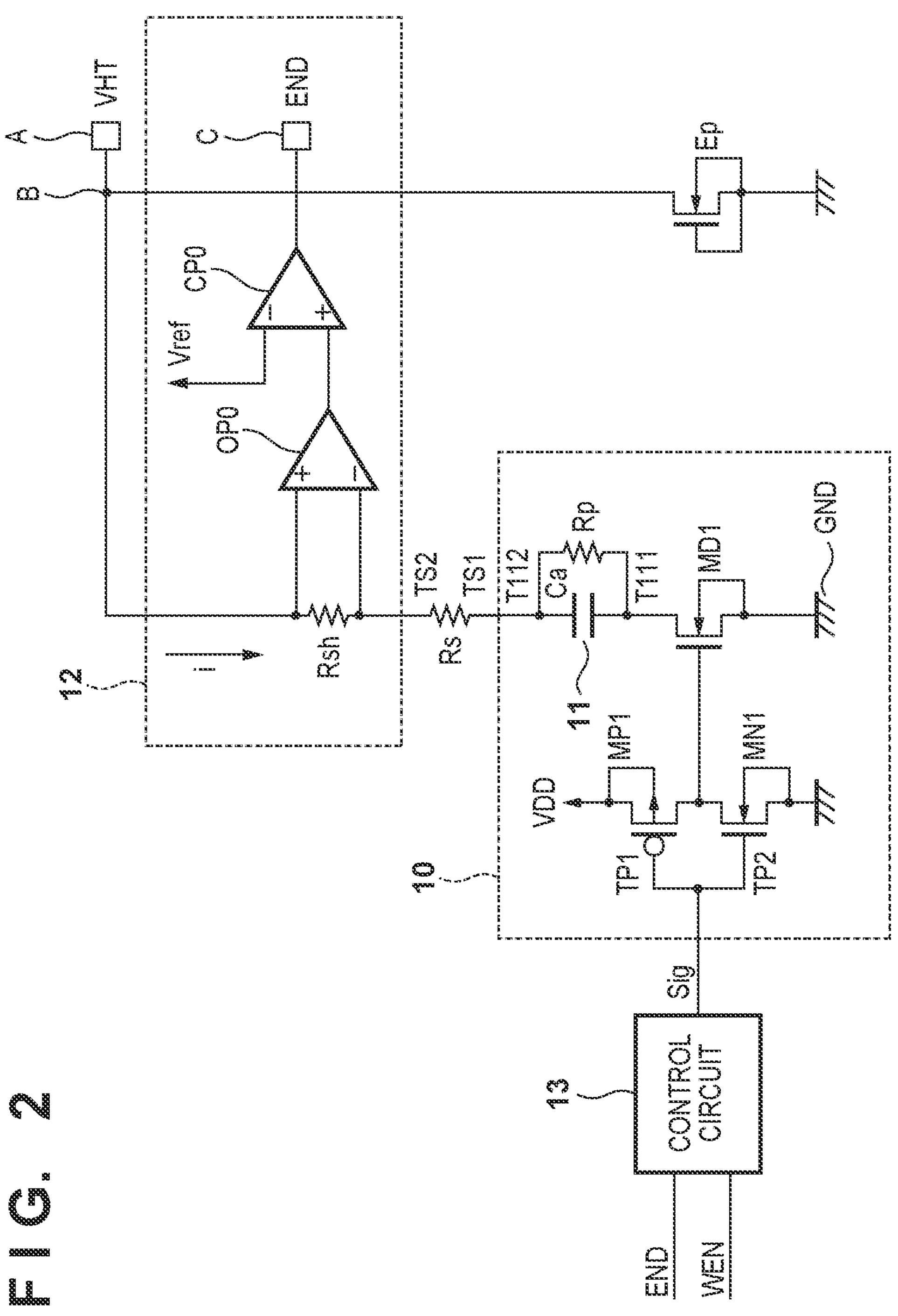
FIG. 2 is a circuit diagram including the memory unit of the semiconductor storage device showing another mode of the first embodiment.

FIG. 2 is a circuit diagram including the memory unit 10 of the semiconductor storage device showing another mode of the first embodiment. FIG. 2 shows a state before information is written in the anti-fuse element 11 of the memory unit 10. Note that the same reference numerals and symbols as in FIG. 1 denote the same parts in FIG. 2, and a description thereof will be omitted.

In FIG. 2, a high breakdown voltage NMOS transistor is used as the ESD protection element EP shown in FIG. 1. The gate and source of the high breakdown voltage NMOS transistor as the ESD protection element EP are grounded.

An operation in writing in the anti-fuse element 11, a method of determining whether information has been written in the anti-fuse element 11, and a use of the determination result as to whether information has been written in the anti-fuse element 11 are similar to those described with reference to FIG. 1.

As has been described above, according to the first embodiment, the write state of the anti-fuse element 11 is determined based on the output signal END. With this, it is possible to reliably determine the write state of the semiconductor storage device with improved ESD resistance.

Second Embodiment

In the second embodiment, as an application example of the semiconductor storage device described in the first embodiment, an example in which the semiconductor storage device shown in FIG. 2 is applied to a printing apparatus will be described.

Figure 3:
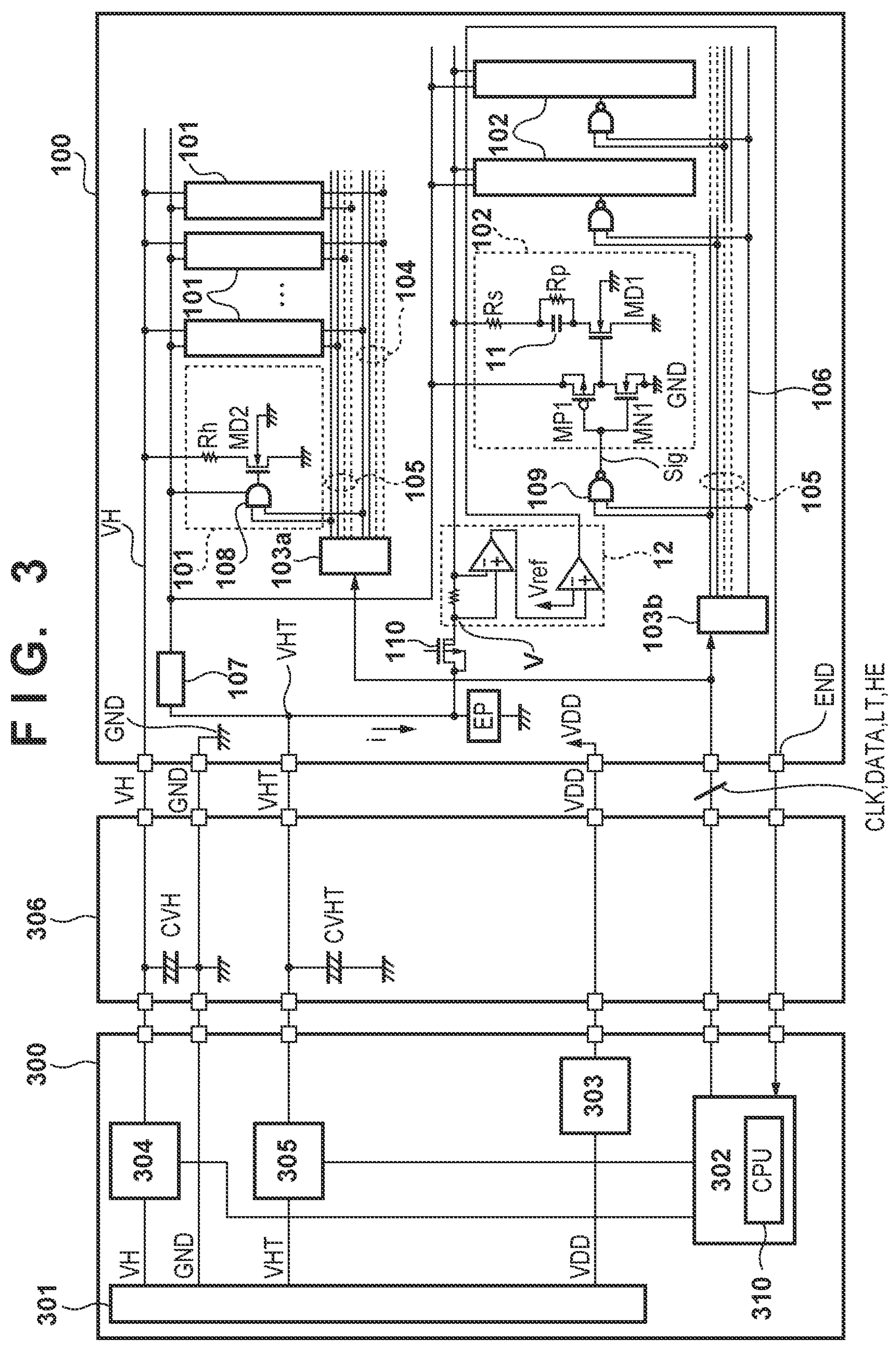
FIG. 3 is a block diagram for explaining connections with a printhead in a printing apparatus according to the second embodiment.

FIG. 3 is a block diagram for explaining connections with a printhead in a printing apparatus according to the second embodiment.

A printhead board 100 includes the semiconductor storage device shown in FIG. 1 or 2. The main body side of the printing apparatus includes a printing apparatus control board 300 for controlling the printhead board 100, and a carriage board 306 for transmitting the power supply and signal of the printing apparatus control board 300 to the printhead board 100.

The printing apparatus control board 300 includes a power supply generation circuit 301, a printing apparatus control circuit 302, a VDD control circuit 303, a VH control circuit 304, and a VHT control circuit 305.

The power supply generation circuit 301 supplies a first power supply voltage VDD, a second power supply voltage VH, and a third power supply voltage VHT, and provides a ground potential GND, which are necessary to operate the printing apparatus. The printing apparatus control circuit 302 is a control circuit that controls the printing apparatus. The printing apparatus control circuit 302 includes a CPU 310, and outputs a clock signal CLK for controlling the printhead board 100, an image data signal DATA, a latch signal LT, and a heater control signal HE. Further, the printing apparatus control circuit 302 controls the VDD control circuit 303 that controls output of the first power supply voltage VDD, the VH control circuit 304 that controls output of the second power supply voltage VH, controls the VHT control circuit 305 that controls output of the third power supply voltage VHT, and controls take-in of an output signal of the printhead board 100.

The carriage board 306 is a board that electrically connects signals and power supplies between the printhead board 100 and the printing apparatus control board 300.

The printhead board 100 includes printing units 101 each including a heating element (discharge element) (Rh), which is used to discharge ink from a discharge port, and a drive unit or element for the heating element, memory units 102 each corresponding to the memory unit 10 described above, printhead control circuits 103*a* and 103*b*, and a step-down circuit 107. The printhead board 100 further includes a ROM write power supply control element 110, an input terminal and a wiring circuit for the first power supply voltage VDD, an input terminal and a wiring circuit for the second power supply voltage VH, an input terminal and a wiring circuit for the third power supply voltage VHT, a connection terminal and a ground wiring for the ground wiring GND, and a write state detection unit 12 described above.

The step-down circuit 107 is a power supply circuit that steps down the third power supply voltage VHT to generate a fourth power supply voltage VH™. The ROM write power supply control element 110 is an element for applying an anti-fuse element write power supply to an anti-fuse element 11 when the printing apparatus control circuit 302 sets the write set state with respect to the anti-fuse element 11 of the memory unit 102 via the printhead control circuit 103*b*.

The memory unit 102 includes an inverter including a first transistor MP1 and a second transistor MN1, a third transistor MD1, the anti-fuse element 11, a resistor element Rs, a node B, and an ESD protection element EP. The printing unit 101 includes the heater Rh (electrothermal transducer) and a drive unit (for example, a transistor MD2 and an AND circuit 108) that drives the heater Rh. By driving the heater Rh, that is, by generating heat by energizing the heater Rh, a printing agent (for example, ink) is discharged and printing can be performed.

Each of the printhead control circuit 103*a* and the printhead control circuit 103*b* can be formed by, for example, a shift register, a latch circuit, and the like (all are not shown). The clock signal CLK, the image data signal DATA, the latch signal LT, and the heater control signal HE may be input from the printing apparatus control circuit 302 to the printhead control circuits 103*a* and 103*b* via a host PC (not shown) or the like. The fourth power supply voltage VH™ (for example, 3 to 5 V) is supplied, as a transistor driving power supply voltage, to an AND circuit 108, a NAND circuit 109, and the printhead control circuits 103*a* and 103*b*. Accordingly, each of the heater Rh of the printing unit 101 and the memory unit 102 (semiconductor storage device) is electrically connected to the printhead control circuit 103*a* and the printhead control circuit 103*b*, respectively.

Here, for example, for m groups each including n printing units 101, the printhead control circuit 103*a* can perform time division driving in which the printhead control circuit 103*a* controls operations of the printing units 101 to drive the heaters Rh for each group. In the time division driving, the printhead control circuit 103*a* outputs an m-bit block selection signal 104 and an n-bit time division selection signal 105, and the selected printing units 101 in the selected block are driven in accordance with print data to perform printing. The corresponding block selection signal 104 and time division selection signal 105 are input to the AND circuit 108 and, in response to this, the transistor MD2 is set in a conductive state and the heater Rh connected in series with the transistor MD2 is driven. Here, the second power supply voltage VH (for example, 24 V) is supplied as the heater driving power supply voltage to the printing unit 101, and the ground potential is defined as GND.

A control signal 106 and the time division selection signal 105 are input to the NAND circuit 109, and a signal corresponding to this is output from the inverter to the transistor MD1. With this, the transistor MD1 is switched between a conductive state and a nonconductive state. In the semiconductor storage device shown in FIG. 1, the third power supply voltage VHT (for example 24.0 V) for writing information to the anti-fuse element 11 is supplied, and the ground potential is defined as GND.

At least one ESD protection element EP is arranged between the VHT terminal and the ground terminal. In this case, the memory unit 102 includes, for example, the inverter, the third transistor MD1, the anti-fuse element 11, the resistor element Rs, and a resistor element Rp.

Note that the arrangement is shown in FIG. 3 in which both the printing unit 101 and the memory unit 102 are connected to the control circuits 103*a* and 103*b*, but they may be connected to different control circuits.

The write state detection unit 12 outputs, using an output signal END, the write state of the anti-fuse element 11, with respect to which the printing apparatus control circuit 302 has performed write setting via the printhead control circuit 103*b*. If the anti-fuse element 11 is in the unwritten state, the output signal END is output at low level. If the anti-fuse element 11 is in the write state, the output signal END is output at high level. The printing apparatus control circuit 302 uses the state of the output signal END of the write state detection unit 12 to control continuation and stop of the write operation based on the write state of the anti-fuse element 11.

FIG. 4 is a flowchart for explaining a write operation of the anti-fuse element 11 performed by the printing apparatus control circuit 302 of the printing apparatus according to the second embodiment. Note that the process illustrated in this flowchart is implemented by the CPU 310 of the printing apparatus control circuit 302 executing a program stored in a memory (not shown).

First, in step S401, in accordance with an instruction via the host PC (not shown) or the like of the printing apparatus, the CPU 310 sets information for performing writing in the respective anti-fuse elements 11 of the memory units 102 of the printhead board 100. Then, the process advances to step S402, and the CPU 310 selects the first memory unit 102 for performing writing in the memory unit 102. Then, the process advances to step S403, and the CPU 310 determines whether the selected memory unit 102 is the write target memory unit indicated by the write information set in step S401. Here, if it is determined that the selected memory unit 102 is not the write target memory unit, the process advances to step S413 to select the next memory unit 102, and the process returns to step S403.

On the other hand, if it is determined in step S403 that the selected memory unit 102 is the write target memory unit, the process advances to step S404, and the CPU 310 sets the write set state with respect to the anti-fuse element 11 of the selected memory unit 102 via the printhead control circuit 103*b*. Then, the process advances to step S405, and the CPU 310 controls the VHT control circuit 305 and the ROM write power supply control element 110 to apply a voltage 24.0 [V] to the anti-fuse element 11 of the memory unit 102. The process advances to step S406, and the CPU 310 drives a control signal Sig, which is an output of the NAND circuit 109, so as to be switched between high level and low level at a predetermined cycle (for example, 6.25 [MHz]). That is, a pulse signal that alternately switches the control signal 106 between high level and low level is applied to the printhead control circuit 103*b* to perform pulse-driving. Here, when the pulse signal is at high level, a current flows to the corresponding anti-fuse element and writing is performed.

Then, the process advances to step S407, and the CPU 310 checks the state of the output signal END of the write state detection unit 12 to determine whether the output signal END is at high level, that is, whether writing in the anti-fuse element 11 of the write target memory unit 102 is complete. Here, if the output signal END is in the unwritten state (low level), the process returns to step S406, and the pulse signal that alternately switches the control signal 106 between high level and low level is applied to the printhead control circuit 103*b*.

If the CPU 310 determines in step S407 that the output signal END is set in the write state (high level), the process advances to step S408, and the pulse signal is output as in step S406 described above. Then, if the pulse signal is output for a period set by a write completion determination timer in step S409, the process advances to step S410. This step is performed to terminate the writing in the anti-fuse element 11 after the predetermined time elapses since the output signal END is output at high level indicating the write state of the anti-fuse element 11.

The process advances to step S410, and the CPU 310 stops outputting the pulse signal as the control signal 106. The process advances to step S411, and the CPU 310 controls the VHT control circuit 305 and the ROM write power supply control element 110 to set the voltage applied to the anti-fuse element 11 of the memory unit 102 to 0.0 [V]. The process advances to step S412, and the CPU 310 determines whether the write target memory unit 102 is the last memory unit 102. Here, if the write target is the last memory unit 10*d* (anti-fuse element 11), the write operation of the printhead board 100 is terminated. If the write target is not the last memory unit 102, the process advances to step S413 to select the next memory unit 102, and the process similar to the above-described process is performed.

In this manner, it is possible to reliably perform writing in the anti-fuse element 11 of the memory unit 102.

Note that the printing apparatus control circuit 302 also has a function of reading out data stored in the anti-fuse element 11 of the memory unit 102.

Figure 5:
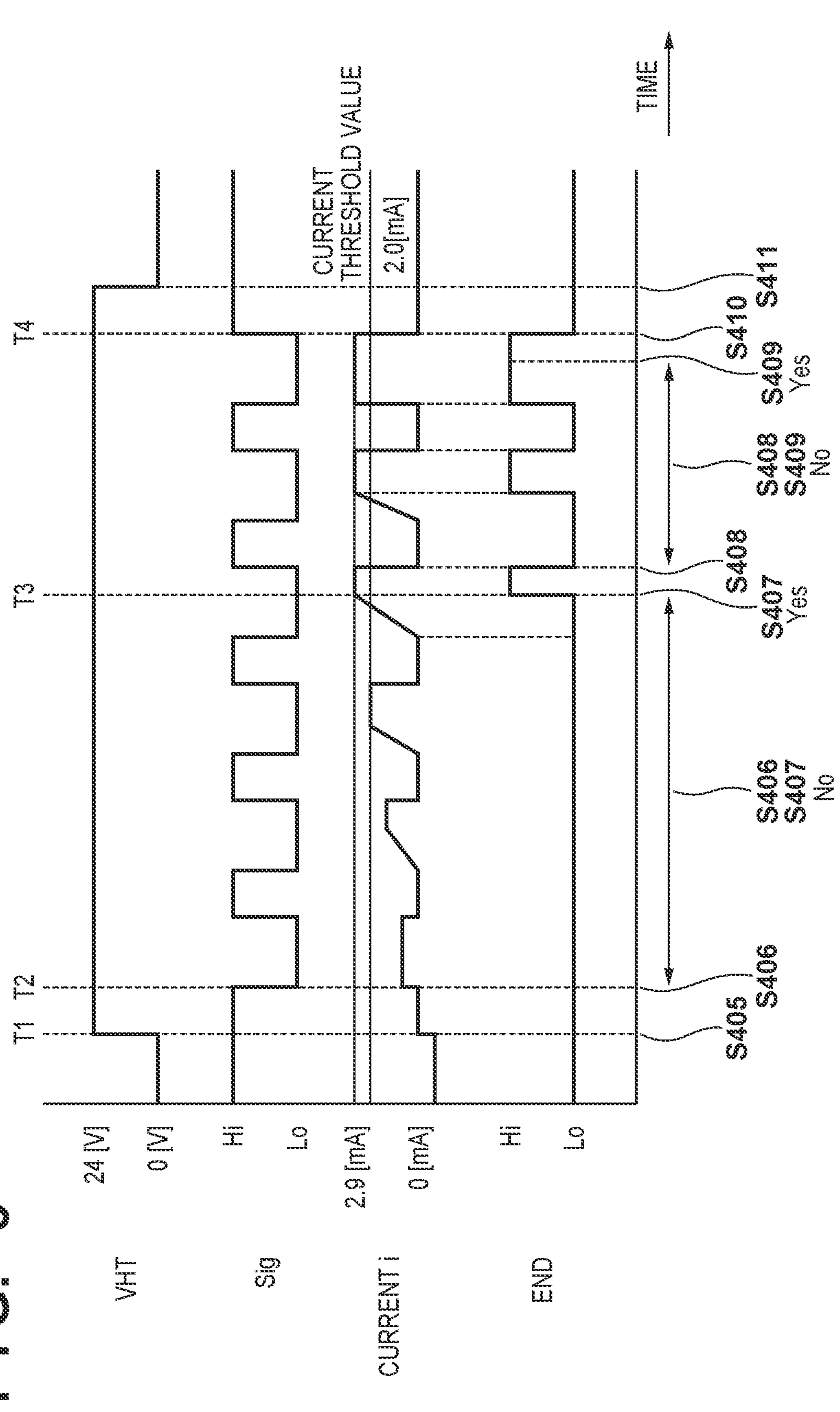
FIG. 5 is a timing chart showing timings in the write operation of the anti-fuse element performed by the printing apparatus control circuit according to the second embodiment.

FIG. 5 is a timing chart showing timings in the write operation of the anti-fuse element 11 performed by the printing apparatus control circuit 302 according to the second embodiment.

FIG. 5 shows the applied voltage of the VHT terminal, the control signal Sig, a current i flowing to the VHT terminal, the state of the output signal END indicating the write state of the anti-fuse element 11, and the threshold value of the write current, which is 2.0 [mA]. Note that steps S405 to S411 in FIG. 5 are shown in association with the operation illustrated in the flowchart of FIG. 4.

In FIG. 5, a timing T1 is a timing at which the voltage 24.0 [V] is applied to the anti-fuse element 11 of the memory unit 102 in step S405. A timing T2 is a timing at which the first write pulse is applied, and a timing T3 is a timing at which it is confirmed that the output signal END is set in the write state (high level) in step S407. The period from the timing T3 to a timing T4 indicates the elapse time of the write completion determination timer. In this manner, it is stopped to output the pulse signal after the predetermined time elapses since the output signal END is set at high level, and the voltage VHT applied to the anti-fuse element 11 of the memory unit 102 is set to 0.0 [V].

Figure 6:
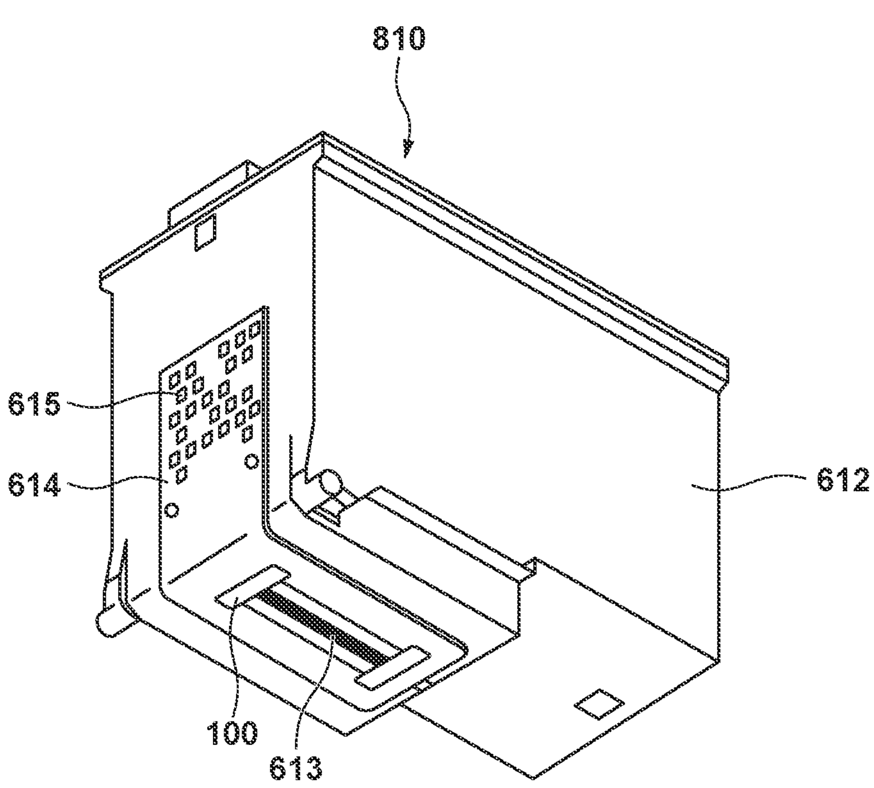
FIG. 6 is a perspective view of a printhead as a liquid discharge head unit that can be mounted on the printing apparatus according to the second embodiment.

FIG. 6 is a perspective view of a printhead 810 as a liquid discharge head unit that can be mounded on the printing apparatus according to the second embodiment.

The printhead 100 as the liquid discharge head provided in the printhead 810 is electrically connected to contact pads 615 that connect to the printing apparatus via a flexible film wiring board 614. Note that the printhead 810 has a structure in which the printhead 100 and an ink tank 612 are integrally formed, but it is also possible to make the printhead 810 such that the ink tank is separatable.

The printhead 810 receives, by the contact pads 615, electrical signals from a carriage board mounted on a carriage 920 (FIG. 7), and discharges ink in accordance with the electrical signals, thereby performing printing described above. The ink tank 612 includes, for example, a fibrous or porous ink holding material (not shown), and the ink can be held by the ink holding material.

Figure 7:
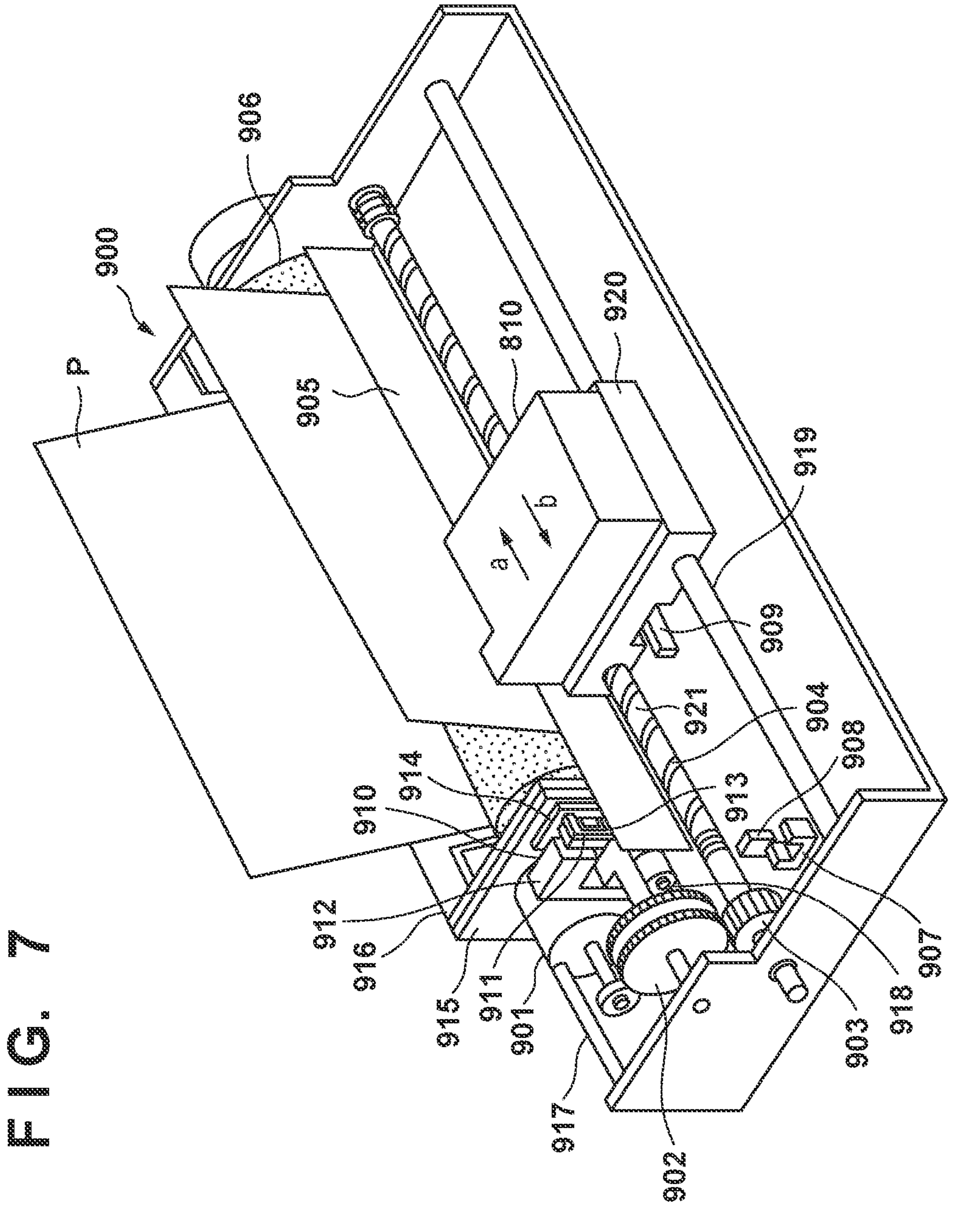
FIG. 7 is an outer perspective view of a mechanical section with a cover removed therefrom of the printing apparatus according to the second embodiment.

FIG. 7 is an outer perspective view showing a mechanical section with a cover removed therefrom of a printing apparatus 900 according to the second embodiment.

The printhead 810 is a printhead, a part of which is shown in FIG. 6, and can be mounted on the carriage 920. The carriage 920 is attached to a lead screw 904 with a helical groove 921. As the lead screw 904 rotates, the printhead 810 moves along a guide 919 in the direction of an arrow a or an arrow b together with the carriage 920. The rotation of the lead screw 904 interlocks with the rotation of a drive motor 901 via driving force transmission gears 902 and 903.

A conveyance unit (not shown) conveys a print sheet P onto a platen 906. A paper pressing plate 905 presses the print sheet P against the platen 906 along the carriage moving direction. The printing apparatus 900 confirms, via photocouplers 907 and 908, the position of a lever 909 provided on the carriage 920, and switches the rotation direction of the drive motor 901. A support member 910 supports a cap member 911 that caps each nozzle of the printhead 810. A suction means 912 performs recovery processing by suction of the printhead 810 via an intra-cap opening 913 by sucking the interior of the cap member 911.

A known cleaning blade is used as a cleaning blade 914. A moving member 915 moves the cleaning blade 914 forward and backward. A main body support plate 916 supports the moving member 915 and the cleaning blade 914. A lever 917 is provided to start the recovery processing by suction.

The lever 917 moves along with the movement of a cam 918 that engages with the carriage 920. The driving force from the drive motor 901 is controlled by a known transmission means such as clutch switching. A printing control unit (not shown) is provided in the printing apparatus 900. In accordance with an electrical signal such as print data input from the outside, the printing apparatus 900 controls driving of each mechanism. By repeatedly moving the printhead 810 reciprocally and conveying the print sheet P by the conveyance unit (not shown), the printing apparatus 900 can complete printing on the print sheet P.

As has been described above, by using the method of determining the write state of the anti-fuse element described in the second embodiment, it is possible to reliably determine the write state of the anti-fuse element in a printing apparatus including a semiconductor storage device with improved ESD resistance.

Third Embodiment

In the third embodiment, an example will be described in which the write state detection unit 12 of the printing apparatus 900 described in the second embodiment is mounted on a carriage board 801.

Figure 8:
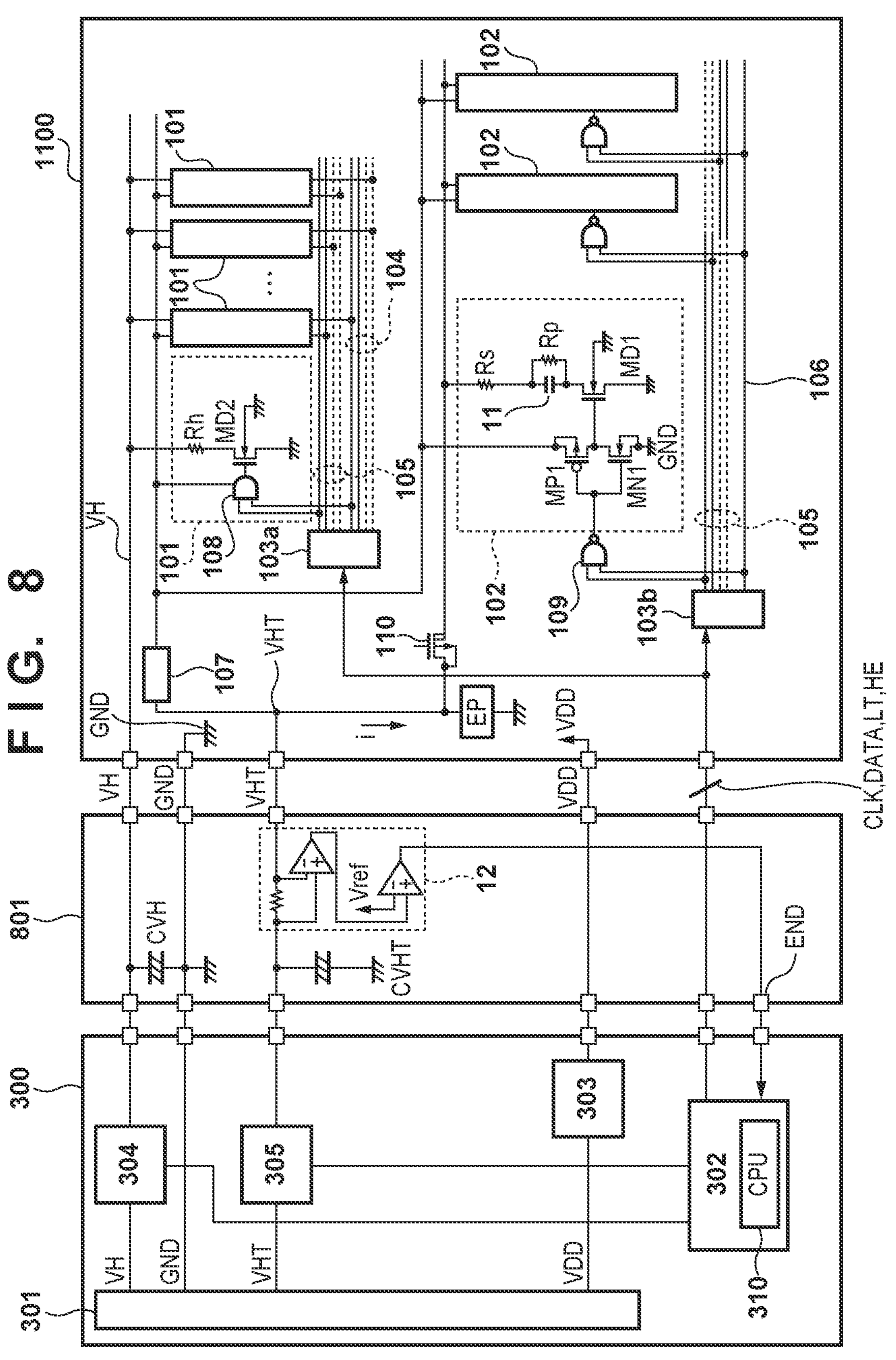
FIG. 8 is a block diagram for explaining connections with a printhead in a printing apparatus according to the third embodiment.

FIG. 8 is a block diagram for explaining connections with a printhead in a printing apparatus according to the third embodiment. Note that the same reference numerals as in above-described FIG. 3 denote the same parts in FIG. 8, and a description thereof will be omitted.

Here, an example of the circuit arrangement of a printhead board 1100 including the semiconductor storage device according to the first embodiment, the circuit arrangement of a printing apparatus control board 300 that controls the printhead board 1100, and a control circuit of the printing apparatus 900 including the carriage board 801 that transmits power supplies and signals of the printing apparatus control board 300 to the printhead board 1100 is shown.

The carriage board 801 is a board that electrically connects signals and power supplies between the printhead board 1100 and the printing apparatus control board 300, and includes the write state detection unit 12 described above.

The operation of a printing apparatus control circuit 302 to control continuation and stop of the write operation based on the write state of an anti-fuse element 11 by using the state of an output signal END of the write state detection unit 12, and the flowchart illustrating the procedure of the determination process of the printing apparatus control circuit 302 are similar to those in the above-described second embodiment.

According to the third embodiment, by determining the write state of the anti-fuse element 11 using the output signal END, even if the write state detection unit is mounded on the carriage board, it is possible to reliably determine the write state of the semiconductor storage device with improved ESD resistance.

Fourth Embodiment

In the fourth embodiment, an example will be described in which the write state detection unit 12 of the printing apparatus 900 described in the second embodiment is mounted on a printing apparatus control board 2930.

Figure 9:
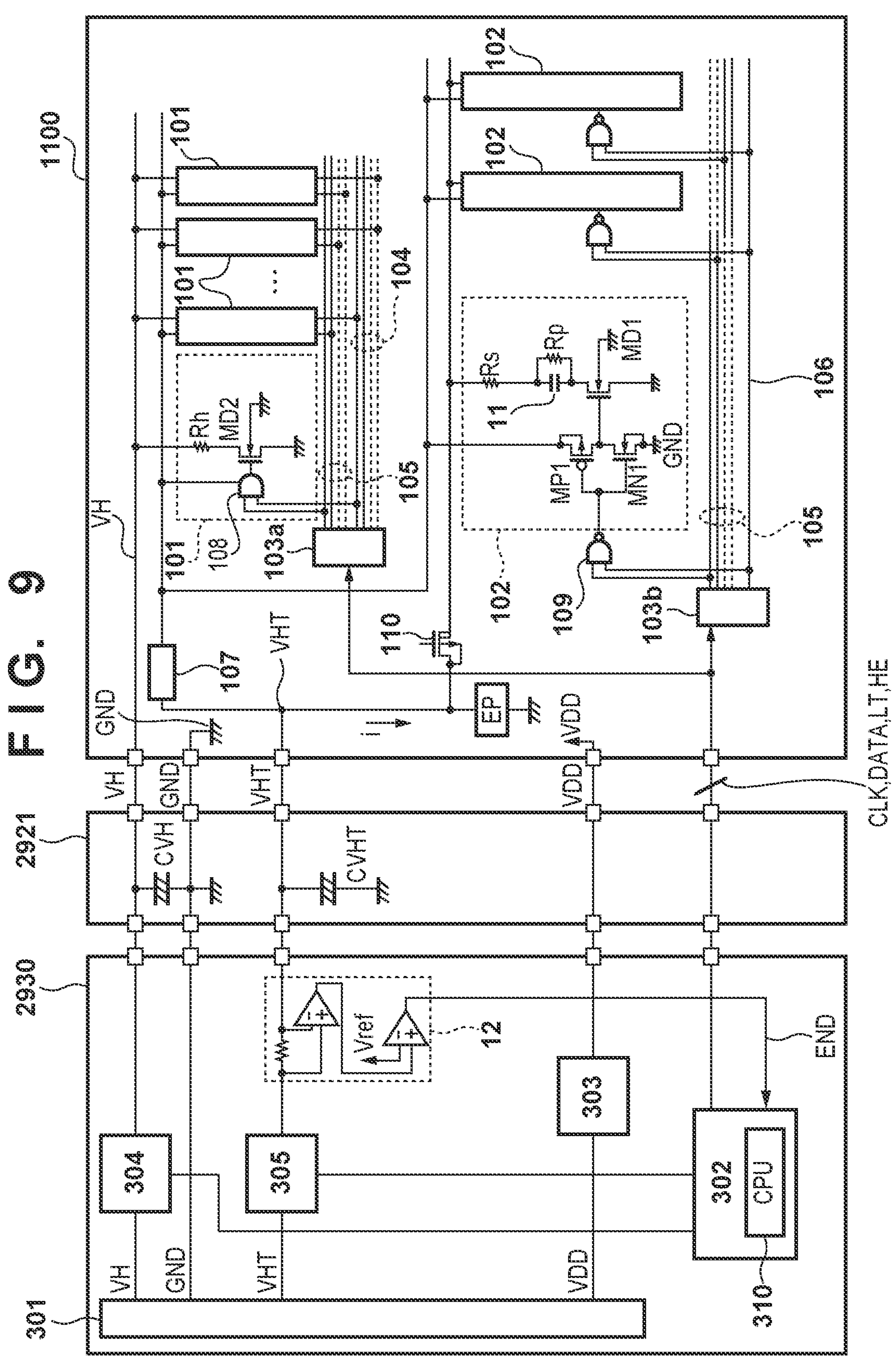
FIG. 9 is a block diagram for explaining connections with a printhead in a printing apparatus according to the fourth embodiment.

FIG. 9 is a block diagram for explaining connections with a printhead in a printing apparatus according to the fourth embodiment. Note that the same reference numerals as in above-described FIG. 3 denote the same parts in FIG. 9, and a description thereof will be omitted.

An example of the circuit arrangement of a printhead board 1100 including the semiconductor storage device described in the first embodiment, the circuit arrangement of the printing apparatus control board 2930 that controls the printhead board 1100, and a control circuit of the printing apparatus 900 including a carriage board 2921 that transmits power supplies and signals of the printing apparatus control board 2930 to the printhead board 1100 is shown.

The carriage board 2921 is a board that electrically connects signals and power supplies between the printhead board 1100 and the printing apparatus control board 2930. The printing apparatus control board 2930 includes a power supply generation circuit 301, a printing apparatus control circuit 302, a VDD control circuit 303, a VH control circuit 304, a VHT control circuit 305, and the write state detection unit 12.

The write state detection unit 12 outputs, using an output signal END, the write state of an anti-fuse element 11 corresponding to the state in which the printing apparatus control circuit 302 has performed write setting via a printhead control circuit 103*b*. The printing apparatus control circuit 302 uses the state of the output signal END of the write state detection unit 12 to control continuation and stop of the write operation based on the write state of the anti-fuse element 11. These operations are similar to those in the second embodiment described above.

According to the fourth embodiment, even if the write state detection unit is mounded on the printing apparatus control board, it is possible to reliably determine the write state of the semiconductor device with improved ESD resistance.

As has been described above, according to the embodiments, by converting the current flowing in writing in the anti-fuse element into a voltage and comparing the voltage with the reference voltage, it is possible to accurately determine the write state of the anti-fuse element with improved surge resistance. With this, the write operation of the anti-fuse element can be stopped at a correct timing, so that it is possible to implement power saving by shortening the write time and reducing the write current.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-042777, filed Mar. 17, 2022, which is hereby incorporated by reference herein in its entirety.

What is claimed is:

1. A semiconductor storage device configured to control writing in a memory unit including an anti-fuse element, the device comprising:

a comparison unit configured to compare, with a reference voltage, a voltage generated across a resistor element connected in series with a power supply line used to energize the anti-fuse element; and a control unit configured to, in writing in the memory unit, control writing in the anti-fuse element of the memory unit based on an output of the comparison unit, wherein the comparison unit includes:

an amplifier circuit configured to receive and amplify the voltage generated across the resistor element; and a comparator circuit configured to compare an output of the amplifier circuit with the reference voltage, and the control unit determines, based on an output of the comparator circuit, whether writing in the anti-fuse element of the memory unit is complete.

2. The device according to claim 1, further comprising a power supply control unit configured to, in writing in the memory unit, apply a write voltage to the power supply line used to energize the anti-fuse element.

3. The device according to claim 1, wherein in writing in the memory unit, the control unit performs writing in the anti-fuse element by applying a pulse signal to the anti-fuse element.

4. The device according to claim 3, wherein when the output of the comparison unit indicates that writing in the anti-fuse element of the memory unit is complete, the control unit terminates writing in the anti-fuse element after further applying the pulse signal to the anti-fuse element for a predetermined time.

5. The device according to claim 1, wherein a current supply side of the power supply line is grounded via an ESD protection element.

6. A semiconductor storage device configured to control writing in a memory unit including an anti-fuse element, the device comprising:

a comparison unit configured to compare, with a reference voltage, a voltage generated across a resistor element connected in series with a power supply line used to energize the anti-fuse element; and a control unit configured to, in writing in the memory unit, control writing in the anti-fuse element of the memory unit based on an output of the comparison unit, wherein the memory unit includes the anti-fuse element, a first resistor element connected in parallel with the anti-fuse element, and a drive element configured to control energization of the anti-fuse element.

7. The device according to claim 6, further comprising a third resistor element connected in series between the anti-fuse element and a second resistor element connected in series with the power supply line.

8. A printing apparatus comprising a printhead including a plurality of discharge ports, and a printhead board, wherein the printhead board includes discharge elements provided so as to correspond to the plurality of discharge ports, and drive units electrically connected to the discharge elements, the apparatus includes:

a semiconductor storage device configured to control writing in a memory unit including an anti-fuse element; and a printing apparatus control unit configured to control data writing in the semiconductor storage device and data reading out from the semiconductor storage device, the semiconductor storage device includes:

a comparison unit configured to compare, with a reference voltage, a voltage generated across a resistor element connected in series with a power supply line used to energize the anti-fuse element; and a control unit configured to, in writing in the memory unit, control writing in the anti-fuse element of the memory unit based on an output of the comparison unit, and the comparison unit includes:

an amplifier circuit configured to receive and amplify the voltage generated across the resistor element; and a comparator circuit configured to compare an output of the amplifier circuit with the reference voltage, and the control unit determines, based on an output of the comparator circuit, whether writing in the anti-fuse element of the memory unit is complete.

9. The apparatus according to claim 8, wherein in writing in the memory unit, the printing apparatus control unit determines, based on an output of the comparison unit, whether writing in the anti-fuse element of the memory unit is complete.

10. The apparatus according to claim 8, wherein a comparison unit of the semiconductor storage device is provided on the printhead board.

11. The apparatus according to claim 8, wherein the comparison unit of the semiconductor storage device is provided on a board that electrically connects a signal and a power supply between the printhead board and a control board of the printing apparatus.

12. A write control method of a semiconductor storage device configured to control writing in a memory unit including an anti-fuse element, the device including a comparison unit configured to compare, with a reference voltage, a voltage generated across a resistor element connected in series with a power supply line used to energize the anti-fuse element, the comparison unit including: an amplifier circuit configured to receive and amplify the voltage generated across the resistor element; and a comparator circuit configured to compare an output of the amplifier circuit with the reference voltage, the method comprising:

selecting a write target anti-fuse element;

energizing the selected anti-fuse element via the power supply line; and controlling writing in the anti-fuse element based on an output of the comparison unit configured to compare, with the reference voltage, a voltage generated, by the energizing, across the resistor element connected in series with the power supply line, wherein it is determined in the controlling whether writing in the anti-fuse element of the memory unit is complete based on an output of the comparator circuit.

* * * * *